United States Patent [19]

Shinkai

[11] Patent Number: 5,661,689
[45] Date of Patent: Aug. 26, 1997

[54] SEMICONDUCTOR DEVICE INCORPORATING FUSE-TYPE ROLL CALL CIRCUIT

[75] Inventor: Eiji Shinkai, Tokyo, Japan

[73] Assignee: NEC Corporation, Tokyo, Japan

[21] Appl. No.: 594,173

[22] Filed: Jan. 31, 1996

[30] Foreign Application Priority Data

Jan. 31, 1995 [JP] Japan ................................. 7-034387

[51] Int. Cl.$^6$ ........................................................ G11C 7/00
[52] U.S. Cl. .......................... 365/200; 365/201; 365/225.7
[58] Field of Search ..................................... 365/200, 201, 365/225.7, 226, 96

[56] References Cited

U.S. PATENT DOCUMENTS

| | | | |
|---|---|---|---|
| 4,567,580 | 1/1986 | Varshney | 365/200 |
| 5,008,857 | 4/1991 | Mizoguchi | 365/200 |
| 5,124,949 | 6/1992 | Morigami | 365/226 |
| 5,311,472 | 5/1994 | Ota | 365/200 |
| 5,381,371 | 1/1995 | Haraguchi | 365/200 |
| 5,471,429 | 11/1995 | Lee et al. | 365/201 |
| 5,517,455 | 5/1996 | McClure et al. | 365/200 |

FOREIGN PATENT DOCUMENTS

| | | |
|---|---|---|
| 0195412 | 9/1986 | European Pat. Off. . |
| 0343344 | 11/1989 | European Pat. Off. . |
| 2-146197 | 6/1990 | Japan . |
| 3-58398 | 3/1991 | Japan . |
| 2209858 | 5/1989 | United Kingdom . |

*Primary Examiner*—David C. Nelms
*Assistant Examiner*—Trong Quang Phan
*Attorney, Agent, or Firm*—Sughrue, Mion, Zinn, Macpeak & Seas

[57] ABSTRACT

A roll call circuit includes a series arrangement of a fuse and a switching element connected between a power supply terminal and a ground voltage terminal. The switching element is controlled by an internal test signal.

13 Claims, 5 Drawing Sheets

SEMICONDUCTOR DEVICE INCORPORATING FUSE-TYPE ROLL CALL CIRCUIT

BACKGROUND OF THE INVENTION

1. Field of the Invention

The present invention relates to a semiconductor device, and more particularly, the improvement of a roll call circuit for detecting an internal test signal.

2. Description of the Related Art

In a semiconductor memory device incorporating normal memory cells and redundancy memory cells, not only a normal decoder for selecting the normal memory cells but also a redundancy decoder for selecting the redundancy memory cells are provided. That is, if a defective memory cell is found in the normal memory calls, an address of such a defective memory address (hereinafter, referred to as a defective address) is written into the redundancy decoder. As a result, when such a defective address is received by the redundancy decoder, the redundany decoder deactivates the normal decoder, and in its place, selects the redundancy memory cell, to thereby replace the defective memory cell with the redundancy memory cell. Thus, the problem of the defective memory cell is alleviated.

The redundancy decoder is usually comprised of a multibit fuse-type programmable read-only memory (PROM). Therefore, writing of a defective address into the redundancy decoder is carried out by laser trimming or the like.

In the above-described device, information indicating whether or not the redundancy decoder is surely trimmed must be read from the exterior of the device. In order to satisfy this requirement, in the prior art, an internal test signal generating circuit for generating the above-mentioned information and a roll cell circuit controlled this information are provided. The internal test signal generating circuit is usually comprised of a one-bit fuse-type PROM which is trimmed simultaneously with the trimming of the redundancy decoder. Also, when the internal test signal generating circuit is trimmed, a through current flows through the roll call circuit. Therefore, whether or not the redundancy decoder is trimmed is dependent upon whether or not a through current is detected from the exterior.

A first prior art roll cell circuit includes a load formed by a P-channel MOS transistor and a switching element formed by an N-channel MOS transistor. The load and the switch element are connected in series between a power supply terminal and a ground voltage terminal. The switching element is turned ON and OFF in accordance with the signal of the internal test signal generating circuit. This will be explained later in detail.

In the above-described first prior art roll call circuit, however, when the internal test signal is high, a through current always flows through the roll call circuit, thus increasing the power dissipation.

In order to reduce the power dissipation, in a second prior art roll call circuit, another switching element is added within a current path of the first prior art roll call circuit (see: JP-A-2-146197). Also, in a third prior art roll call circuit, another switching element is added between the internal test signal generating circuit and the first prior art roll call circuit (see: JP-A-3-58398). Only in an initial state after the power is turned ON or the like, is the additional switching element turned ON, thus reducing the power dissipation. This will be explained later in detail.

In the above-described second and third prior art roll call circuits, however, since the load suppresses the through current, the through current cannot be increased, so that it is difficult to determine whether or not the through current flows. Also, although an abnormal through current in an initial state inherently does not have anything to do with the users, the users often complain about this current, since the user is not informed as to the reason for the current.

SUMMARY OF THE INVENTION

It is an object of the present invention to increase a through current in a roll call circuit of a semiconductor device.

Another object is to provide a semiconductor device including a roll call circuit capable of turning OFF a through current after the semiconductor device is assembled.

According to the present invention, a roll call circuit includes a series arrangement of a fuse and a switching element connected between a power supply terminal and a ground voltage terminal. The switching element is controlled by an internal test signal.

Since the resistance value of the fuse can be small, a through current can be increased. Also, in an assembled state, after the fuse is trimmed, a through current never flows through the roll call circuit.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, prior art roll call circuits will be explained with reference to FIGS. 1, 2, 3 and 4.

Figure 1:
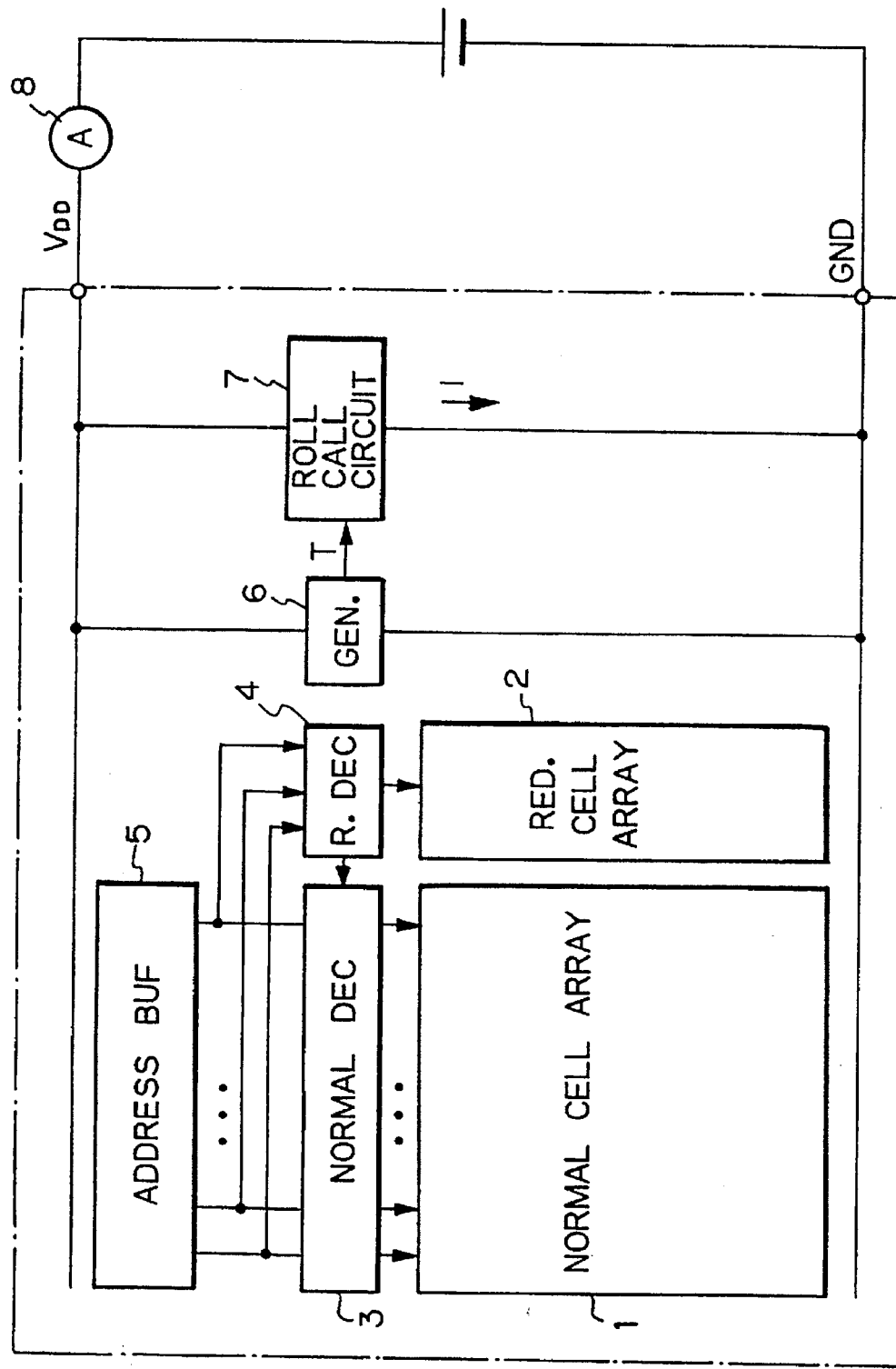
FIG. 1 is a block circuit diagram illustrating a conventional semiconductor memory device.

In FIG. 1, which illustrates a conventional semiconductor memory device, reference numeral 1 designates a normal memory cell array, and 2 designates a redundancy memory cell array such as one or more redundancy memory cell columns. A memory cell column of the normal memory cell array 1 is selected by a normal column decoder 3, and one redundancy memory cell column is selected by a redundancy column decoder 4. The normal column decoder 3 and the redundancy column decoder 4 receive an address signal from a column address buffer 5. Note that, a redundancy memory cell array such as one or more redundancy memory cell rows, a normal row decoder, a redundancy row decoder, and a row address buffer are similar to the redundancy memory cell array 2, the normal column decoder 3, the redundancy column decoder 4, and the column address buffer 5, respectively, but they are not shown for simplicity of the description.

The redundancy column decoder 4 is comprised of a multi-bit fuse-type PROM. If a defective memory cell is found in the normal memory cell array 1, a defective address is written into the redundancy column decoder 4 by laser trimming. In this case, laser trimming is simultaneously performed upon an internal test signal generating circuit 6 which is comprised of a one-bit fuse-type PROM.

Aa a result, when the redundancy column decoder 4 receives the defective address from the column address buffer 5, the redundancy column decoder 4 deactivates the normal column decoder 3, and in its place, selects one redundancy memory cell column of the redundancy memory cell array 2.

The internal test signal generating circuit 6 is connected to a roll call circuit 7. In dependency of an internal test signal T from the internal test signal generating circuit 6, a through current I flows through the roll call circuit 7. Such a through current I is detected by an ampere meter 8 located outside of the device. For example, in a wafer state, the ampere meter 8 is connected to the device by placing plobes on pads thereof.

Figure 2:
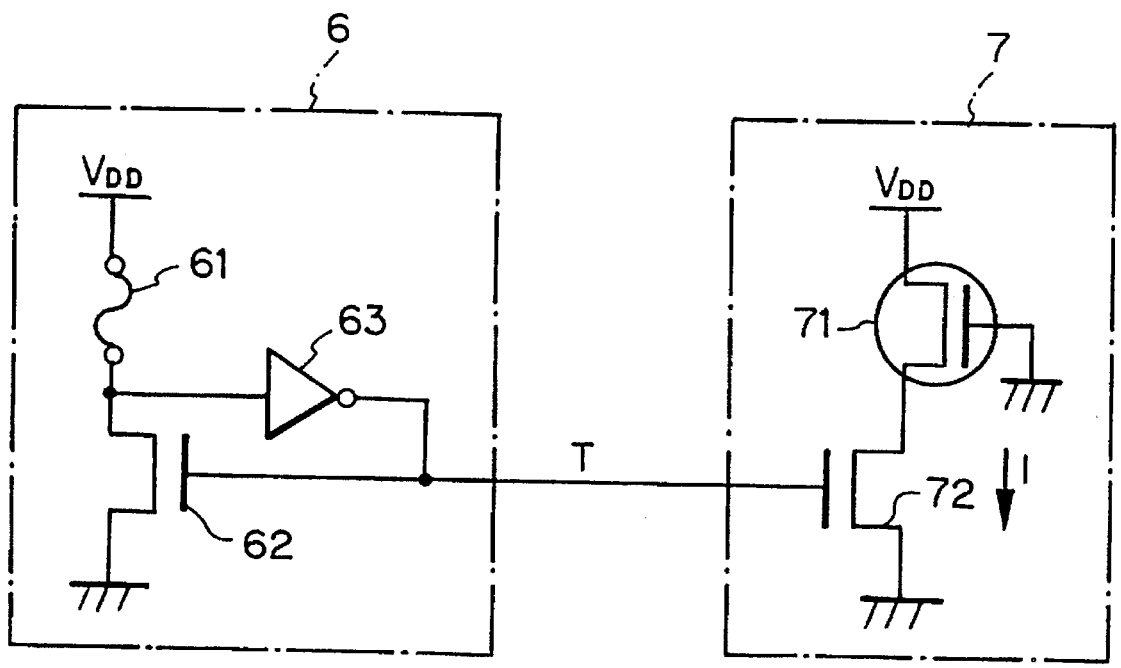
FIG. 2 is a circuit diagram illustrating a first prior art roll call circuit.

In FIG. 2, which illustrates a first prior art roll call circuit connected to an internal test signal generating circuit, the internal test signal generating 6 includes a fuse 61 and an N-channel MOS transistor 62 connected in series between a power supply terminal $V_{DD}$ and a ground voltage terminal GND. Also, a drain voltage of the transistor 62 is fed back to a gate thereof by an inverter 63 which generates the internal test signal T. Therefore, if the fuse 61 is not melted, the internal test signal T is low (=GND). Conversely, if the fuse 61 is melted, the internal test signal T is high (=$V_{DD}$).

Also, in FIG. 2, the roll call circuit 7 includes a P-channel MOS transistor 71 serving as a load and an N-channel MOS transistor 72 connected in series between the power supply terminal $V_{DD}$ and the ground voltage terminal GND. Therefore, if the internal test signal T is low, the transistor 72 is turned OFF, so that a through current does not flow. Conversely, if the internal test signal T is high, the transistor 72 is turned ON, so that a through current I flows through the transistors 71 and 72.

In the roll call circuit 7 of FIG. 2, however, if the internal test signal T is high, the through current I always flows through the transistors 71 and 72, which increases the power dissipation.

Figure 3:
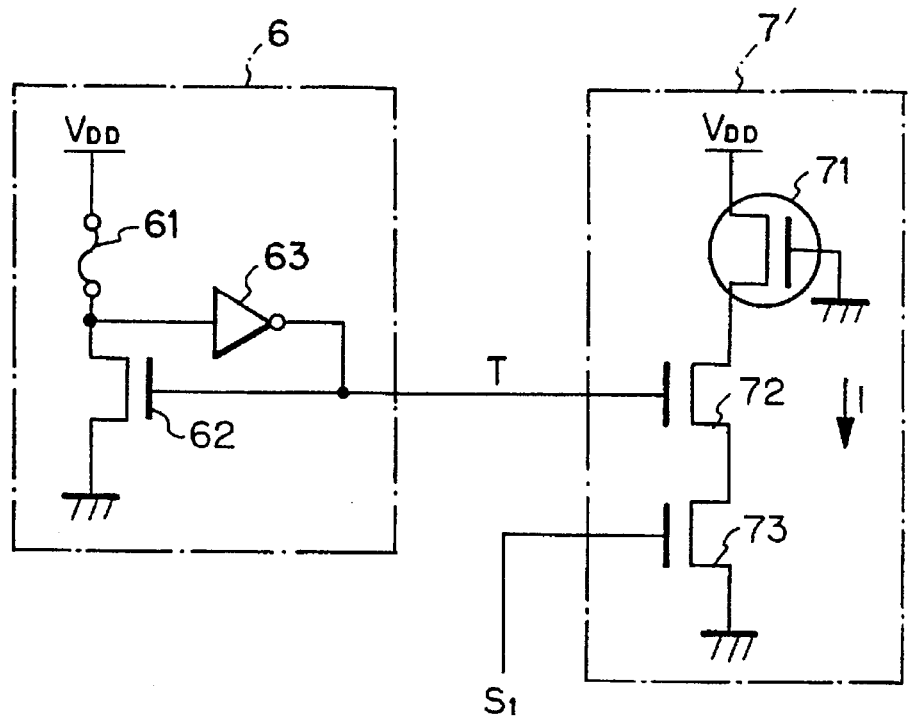
FIG. 3 is a circuit diagram illustrating a second prior art roll call circuit.

In FIG. 3, which illustrates a second prior art roll call circuit connected to an internal test signal generating circuit (see: JP-A-2-146197), the roll call circuit 7' includes an N-channel MOS transistor 73 in addition to the elements of the roll call circuit 7 of FIG. 2. The transistor 73 is controlled by a signal $S_1$ which is generated in an initialized state and in an address transition state. Thus, if the internal test signal T is high, a through current I flows through the transistors 71, 72 and 73 for only a short time period, thus reducing the power dissipation.

Figure 4:
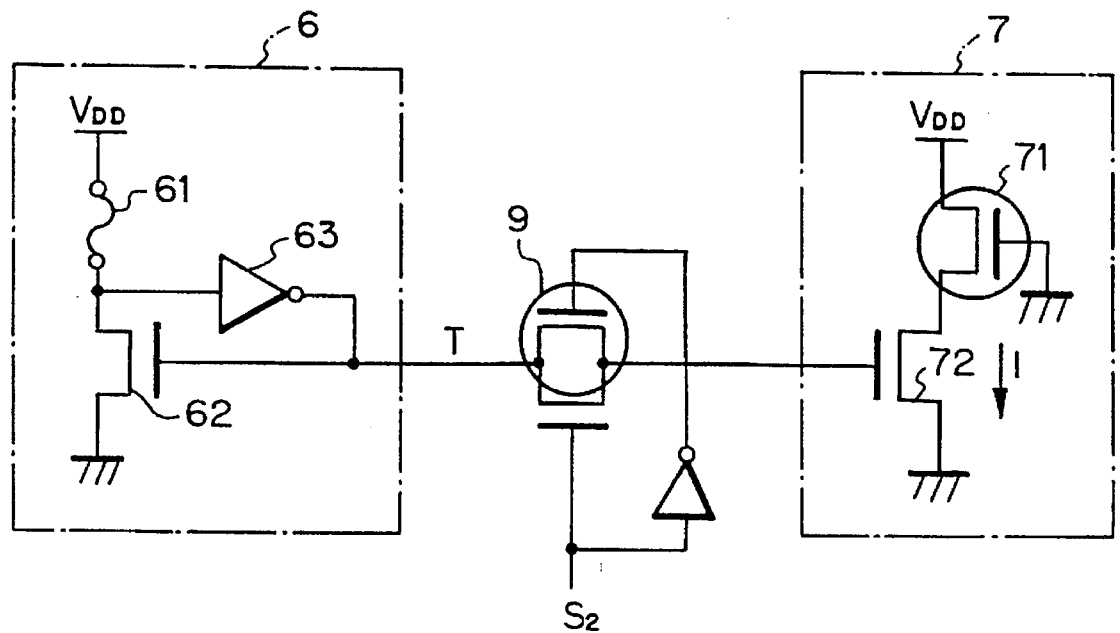
FIG. 4 is a circuit diagram illustrating a third prior art roll call circuit.

In In FIG. 4, which illustrates a third prior art roll call circuit connected to an internal test signal generating circuit (see: JP-A-3-58398), a transfer gate 9 is connected between the internal test signal generating circuit 6 and the roll call circuit 7 of FIG. 2. The transfer gate 9 is controlled by a signal $S_2$ which is generated in an intialized state. Thus, if the internal test signal T is high, a through current I flows through the transistors 71, 72 and 73 for only a short time period, thus reducing the power dissipation.

In FIGS. 3 and 4, however, since the P-channel MOS transistor 71 suppresses the through current I, the through current I cannot be increased, so that it is difficult to determine whether or not the through current I flows. Also, although an abnormal through current in an initial state inherently does not have anything to do with the users, the users often complain about this current, since its reason is not explained to them.

Figure 5:
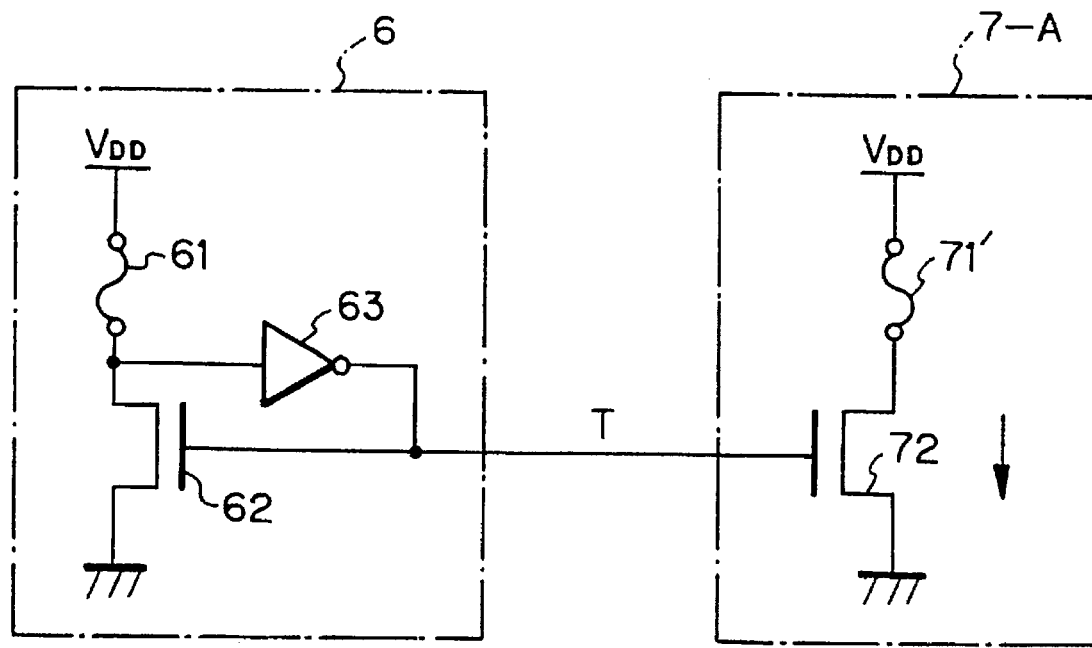
FIG. 5 is a circuit diagram illustrating a first embodiment of the roll call circuit according to the present invention

In FIG. 5, which illustrates a first embodiment of the present invention, a roll call circuit 7-A includes a fuse 71' instead of the P-channel MOS transistor 71 of FIG. 2.

When the fuse 71 is not melted and the internal test signal T is high, a through current I flows through the roll call circuit 7-A. For example, the through current I is about 5 mA depending on the size of the transistor 72. On the other hand, when the fuse 71' is melted or when the internal test signal T is low, a through current I does not flow.

Figure 6:
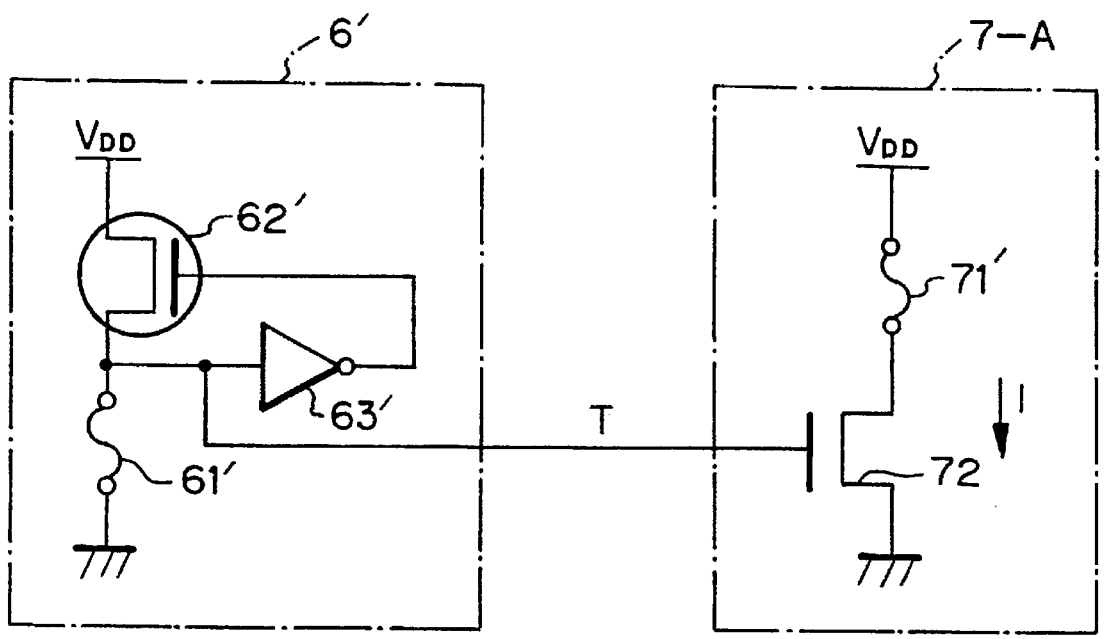
FIG. 6 is a circuit diagram illustrating a modification of the circuit of FIG. 5.

In FIG. 6, which illustrates a modification of the circuit of FIG. 5, the internal test signal generating circuit 6 of FIG. 5 is modified to an internal test signal generating circuit 6 . The internal test signal generating 6' includes a fuse 61' and a P-channel MOS transistor 62' connected in series between the ground voltage terminal GND and the power supply terminal $V_{DD}$. Also, a drain voltage of the transistor 62' is fed back to a gate thereof by an inverter 63'. The input of the inverter 63' serves to produce the internal test signal T. Therefore, if the fuse 61' is not melted, the internal test signal T is low (=GND). Conversely, if the fuse 61' is melted, the internal test signal T is high (=$V_{DD}$). Thus, the internal test signal generating circuit 6' generates the same internal test signal T as in the internal test signal generating circuit 6 of FIG. 5.

Figure 7:
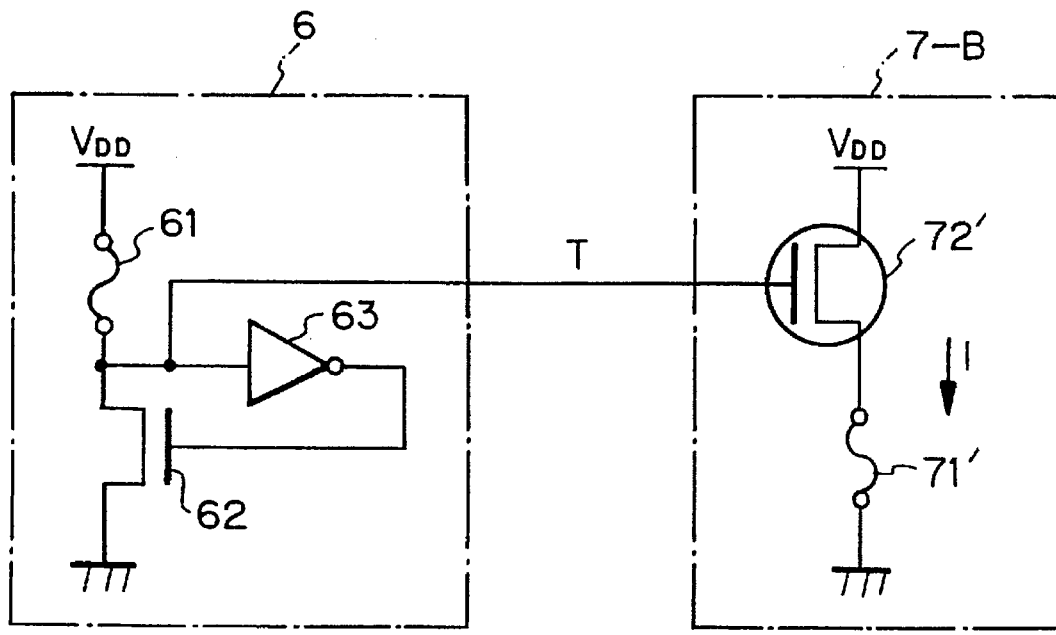
FIG. 7 is a circuit diagram illustrating a second embodiment of the roll call circuit according to the present invention.

In FIG. 7, which illustrates a second embodiment of the present invention, a roll call circuit 7-B includes a P-channel MOS transistor 72' instead of the N-channel MOS transistor 72 of FIG. 5. Also, the fuse 71' is connected to the ground voltage terminal GND, and the transistor 72' is connected to the power supply terminal $V_{DD}$. In this case, the internal test signal T is generated from the input of the inverter 63 of the internal test signal generating circuit 6.

When the fuse 71' is not melted and the internal test signal T is low, a through current I flows through the roll call circuit 7-B. For example, in this case, the through current I is also about 5 mA depending on the size of the transistor 72'. On the other hand, when the fuse 71' is melted or when the internal test signal T is high, a through current I does not flow.

Figure 8:
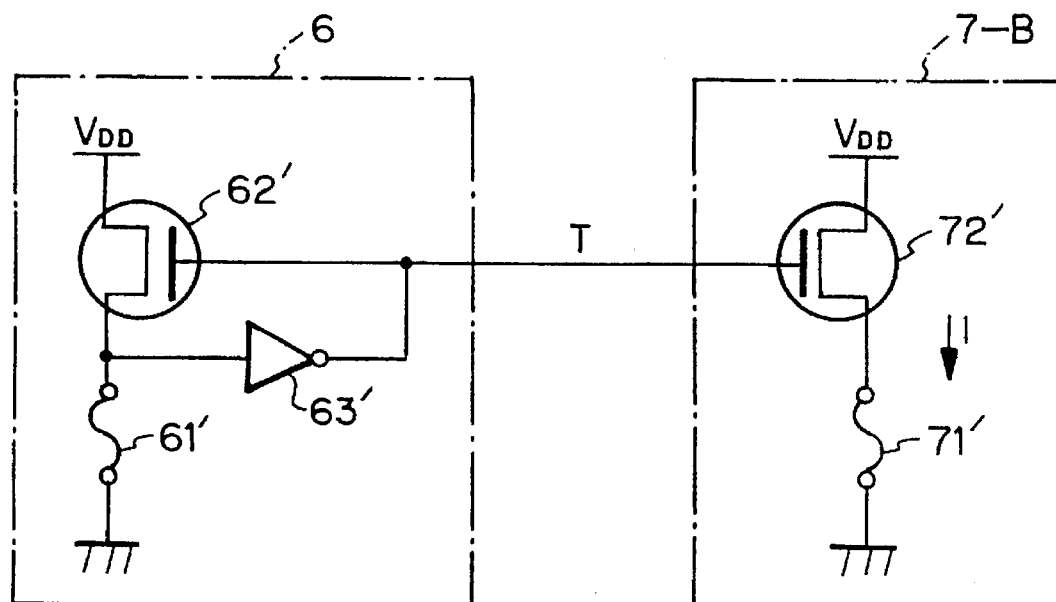
FIG. 8 is a circuit diagram illustrating a modification of the circuit of FIG. 7.

In FIG. 8, which illustrates a modification of the circuit of FIG. 7, the internal test signal generating circuit 6 of FIG. 7 is modified to an internal test signal generating circuit 6', in the same way as in FIG. 6. In this case, the internal test signal T is generated from the output of the inverter 63'. Therefore, if the fuse 61' is not melted, the internal test signal T is high (=$V_{DD}$). Conversely, if the fuse 61' is melted, the internal test signal T is low (=GND). Thus, the internal test signal generating circuit 6' generates the same internal test signal T as in the internal test signal generating circuit 6 of FIG. 7.

In FIGS. 5, 6, 7 and 8, the 71' is not melted in a wafer state. Then, after testing including a roll call test is performed upon the device, the fuses 71 and 71' are melted by laser. Therefore, a through current hardly flows through the device in an assembled state.

As explained hereinbefore, according to the present invention, since the resistance value of the fuse of the roll call circuit can be small, a through current can be increased, which makes it easy to determine whether or not the through current flows. Also, in an assembled state, after the fuse of the roll call circuit is trimmed, a through current never flows through the roll call circuit. Thus, the users are unlikely to complain about an abnormal current.

I claim:

1. A semiconductor device comprising:

a first power supply terminal for receiving a first power voltage;

a second power supply terminal for receiving a second power supply voltage lower than said first power supply voltage;

an internal test signal generating circuit for generating an internal test signal;

a roll call circuit, connected to said internal test signal generating circuit, said first power supply terminal and said second power supply terminal, said roll call circuit including a series arrangement of a first fuse and a first switching element between said first power supply terminal and said second power supply terminal, said first switching element being turned ON and OFF in accordance with said internal test signal.

2. The device as set forth in claim 1, wherein said first switching element comprises a first N-channel MOS transistor connected to said second power supply terminal, said first fuse being connected to said first power supply terminal.

3. The device as set forth in claim 2, wherein said internal test signal generating circuit comprises:

a second fuse connected to said first power supply terminal;

a second N-channel MOS transistor having a drain connected to said second fuse, a source connected to said second power supply terminal, and a gate; and an inverter having an input connected to the drain of said second N-channel MOS transistor and an output connected to the gate of said second N-channel MOS transistor and said roll call circuit.

4. The device as set forth in claim 2, wherein said internal test signal generating circuit comprises:

a second fuse connected to said second power supply terminal;

a P-channel MOS transistor having a drain connected to said second fuse, a source connected to said first power supply terminal, and a gate; and an inverter having an input connected to the drain of said P-channel MOS transistor and an output connected to the gate of said P-channel MOS transistor, the input of said inverter being connected to said roll cell circuit.

5. The device as set forth in claim 1, wherein said first switching element comprises a first P-channel MOS transistor connected to said first power supply terminal, said first fuse being connected to said second power supply terminal.

6. The device as set forth in claim 5, wherein said internal test signal generating circuit comprises:

a second fuse connected to said first power supply terminal;

a N-channel MOS transistor having a drain connected to said second fuse, a source connected to said second power supply terminal, and a gate and an inverter having an input connected to the drain of said N-channel MOS transistor and an output connected to the gate of said N-channel MOS transistor, the input of said inverter being connected to said roll call circuit.

7. The device as set forth in claim 5, wherein said internal test signal generating circuit comprises:

a second fuse connected to said second power supply terminal;

a second P-channel MOS transistor having a drain connected to said second fuse, a source connected to said first power supply terminal, and a gate; and an inverter having an input connected to the drain of said second P-channel MOS transistor and an output connected to the gate of said second P-channel MOS transistor and said roll call circuit.

8. The device as set forth in claim 1, further comprising:

a normal memory call array;

a redundancy memory call array;

a normal decoder, connected to said normal call array, for selecting a memory call from said normal call array;

a redundancy decoder, connected to said redundancy memory call array and said normal decoder, for selecting a memory call from said redundancy memory call, said redundancy decoder comprising a multi-bit fuse-type PROM; and an address buffer connected to said normal decoder and said redundancy decoder, said redundancy decoder selecting the memory call from said redundancy memory call array and deactivating said normal decoder, when an address of said address buffer coincides with a special address written into said redundancy decoder, said internal test signal generating circuit comprising a one-bit fuse-type PROM which is trimmed when said specified address is written into said redundancy decoder.

9. The device as set forth in claim 1, wherein said first fuse is trimmed during device assembly.

10. The device as set forth in claim 9, wherein said first fuse is trimmed using a laser.

11. The device as set forth in claim 1, wherein said first fuse in said roll circuit retains continuity until all testing is completed which is to be performed on the device before packaging, including a roll call test to determine which of a plurality of redundant cells will be used to replace defective memory cells in a normal memory cell array.

12. The device as set forth in claim 11, wherein said roll call test includes said first switching element being activated by said internal test signal and a current through said series arrangement of said first fuse and said first switching element is measured.

13. The device as set forth in claim 1, wherein said internal test signal indicates whether or not a redundancy decoder address fuse has been trimmed and activates said first switching element so as to allow a current to flow through said series arrangement of said first fuse and said first switching element during a roll call test.

* * * * *